US012587201B2

(12) United States Patent
Sarin et al.

(10) Patent No.: US 12,587,201 B2
(45) Date of Patent: Mar. 24, 2026

(54) METHODS AND SYSTEMS FOR LOW NOISE OPERATION OF ANALOG IN MEMORY COMPUTE MAC ARRAYS

(71) Applicants: Vishal Sarin, saratoga, CA (US);
Biprangshu Saha, bangalore (IN);
Sankha Saha, santa clara, CA (US);
Vikram Kowshik, cupertino, CA (US);
Sang T. Nguyen, union city, CA (US)

(72) Inventors: Vishal Sarin, saratoga, CA (US);
Biprangshu Saha, bangalore (IN);
Sankha Saha, santa clara, CA (US);
Vikram Kowshik, cupertino, CA (US);
Sang T. Nguyen, union city, CA (US)

( * ) Notice: Subject to any disclaimer, the term of this patent is extended or adjusted under 35 U.S.C. 154(b) by 54 days.

(21) Appl. No.: 18/240,349

(22) Filed: Aug. 30, 2023

(65) Prior Publication Data

US 2024/0128978 A1 Apr. 18, 2024

Related U.S. Application Data

(63) Continuation-in-part of application No. 17/084,610, filed on Oct. 29, 2020, now Pat. No. 11,799,489, and a continuation-in-part of application No. 16/912,694, filed on Jun. 25, 2020, now Pat. No. 11,961,570, and a continuation-in-part of application No. 16/452,308, filed on Jun. 25, 2019, now Pat. No. 12,136,028.

(60) Provisional application No. 63/033,842, filed on Jun. 3, 2020, provisional application No. 62/927,133, filed on Oct. 29, 2019, provisional application No. 62/872,864, filed on Jul. 11, 2019, provisional application No. 62/803,562, filed on Feb. 10, 2019, provisional application No. 62/773,773, filed on Nov. 30, 2018, provisional application No. 62/721,116, filed on Aug. 22, 2018, provisional application No. 62/689,839, filed on Jun. 26, 2018.

(51) Int. Cl.
| | |
|---|---|
| *H03M 1/08* | (2006.01) |
| *G06G 7/16* | (2006.01) |
| *G11C 16/04* | (2006.01) |
| *H03K 7/08* | (2006.01) |
| *H03M 1/10* | (2006.01) |

(52) U.S. Cl.
CPC ............ *H03M 1/0863* (2013.01); *G06G 7/16* (2013.01); *G11C 16/0483* (2013.01); *H03K 7/08* (2013.01); *H03M 1/1057* (2013.01)

(58) Field of Classification Search
CPC .... H03M 1/0863; H03M 1/1057; G06G 7/16; G11C 16/0483; H03K 7/08
See application file for complete search history.

(56) References Cited

U.S. PATENT DOCUMENTS 7,847,532 B2 * 12/2010 Potter ....................... G06F 1/26
323/283

* cited by examiner

*Primary Examiner* — Joseph J Lauture

(57) ABSTRACT

A matrix multiplication and addition (MAC) operating system is described where different cell currents flowing through different cells in a matrix for different PWM time intervals can be integrated and converted into a numeric value for the cumulative charge. The numeric value of the cumulative charge computed by the ADC is equivalent to MAC operations over multiplicity of cells. The operation is inherently error prone due to parasitic coupling effects from the switching of the memory cells in the array. The presented system minimizes the errors due to parasitic coupling through memory array.

14 Claims, 8 Drawing Sheets

501 — CG_line=CG_ref

502 — SG_line

503 — precharge_en_n

504 — phase_control

505 — bl

506 — cell_current

507 — Sense

508 — PWM Start

500

509 — Charge accumulation / PWM pulse width

510 — coupling error

Vdd
0

ΔV

SG transition coupling

801 — CG_line — CG_ref

802 — SG_line — Vdd — 0 v

803 — precharge_en_n

804 — phase_control

805 — bl

806 — cell_current

807 — Sense

ΔV

810

808
PWM Start

809
PWM width

CG transition
coupling coupling
error

800

METHODS AND SYSTEMS FOR LOW NOISE OPERATION OF ANALOG IN MEMORY COMPUTE MAC ARRAYS

BACKGROUND

1. Field

This application generally relates to electronic circuits, and more particularly to a system, method, and article of manufacture of utilizing flash cells for analog multiply-accumulator (MAC).

2. Background

A vital component of the neural network is a Multiplier-and-Accumulator (MAC) unit. An analog low-power MAC implementation may use flash memory cell array which produces respective current while accessed. A flash cell is made of the flash element, and in this implementation, one select NMOS transistor. The select NMOS transistor gate (SG) needs a logic high to enable the flash cell. The voltage level required for this on SG is VDD to enable the flash cell. Therefore, a full rail-to-rail transition is required on SG. The flash element gate terminal is presented as Control Gate (CG). The flash cell can be programmed to different threshold voltages proportional to the neural weight. While the SG enables the cell, the control gate's (CG) analog voltage level controls the current of the cell programmed to a specific threshold voltage. The analog nature of the cell makes it suitable for analog MAC applications. The developed current on each flash cell in a column, while accessed, accumulates charges in a sense capacitor of the MAC system. Any toggle on SG or CG can couple additional charge on the sense capacitor causing errors in the MAC computation system.

The ADC system maintains a constant reference voltage (bl_ref) on the bit line to ensure flash cell current flows under a constant drain to source voltage. During inactive phase when all the flash cells are de-selected, the bit-line voltage collapses. Next, at the beginning of the charge accumulation phase, the opamp that maintains a constant bit-line voltage transitions to settle the bit-line voltage to bl_ref. The bit-line settling time could be large due to undefined bit-line voltage in the previous phase and the parasitic capacitance on the bit-line. The CG/SG charge coupling and the opamp settling delay introduces some errors in the charge development phase that needs to be corrected in the charge sensing stage of the ADC. This invention implements novel methods by which these errors are weeded out during charge accumulation and sensing by the ADC.

SUMMARY OF THE INVENTION

In one aspect, a system for reduction of coupling through a flash cell for an analog MAC system comprising: a PWM (pulse width modulation) generator comprising a "pwm_start_time" port and a "pwm_width_input" port, wherein the PWM generator is configured to receive and operate on a start trigger signal on the "pwm_start time" port and a pulse width signals on the "pwm_width_input" ports; an Analog-to-Digital Converter (ADC) of the analog MAC system that provides an ADC control signal ("precharge_en_n") to the "pwm_start_time" port of the PWM generator, wherein a rising edge of the "precharge_en_n" is used as the triggering signal for a PWM pulse rising edge; a flash cell produces a charge (Q), and wherein an operand for a multiplication operation is provided to the "pwm_width_input" port and a value of the multiplication operation on the "pwm_width_input" port defines the pulse width of the PWM output, wherein the "precharge_en_n" input causes the PWM output signal to transition high and a PWM output signal makes a falling transition upon a timeout as defined by the value of the multiplication operation, wherein the PWM output signal is buffered to produce an SG_line value, and wherein an analog voltage reference voltage (CG_ref) is buffered to produce a control gate line (CG_line) value.

DESCRIPTION

Figure 1:
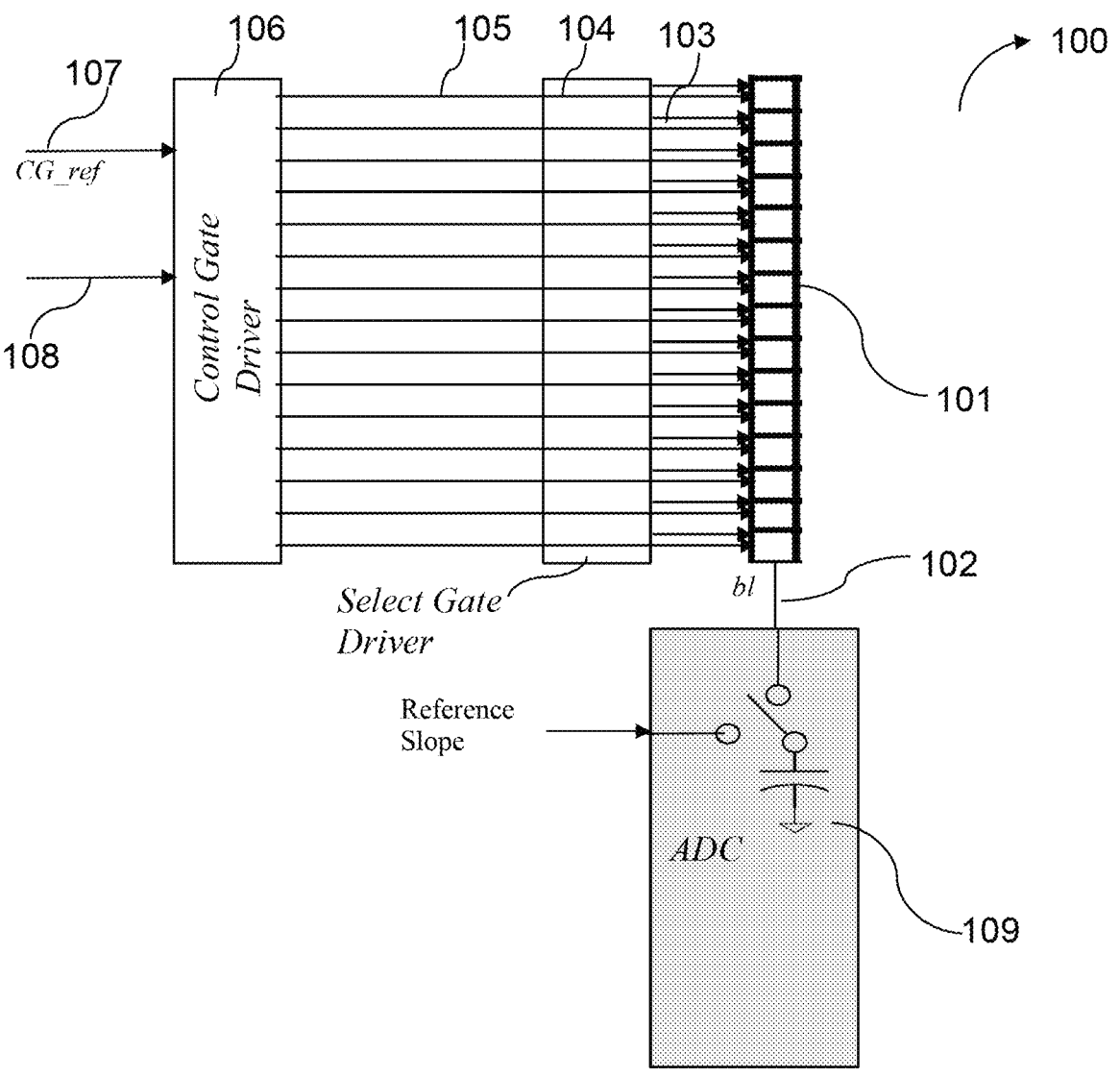
FIG. 1 illustrates an example analog MAC system, according to some embodiments.

Disclosed are a system, method, and article of manufacture for reduction of coupling through a flash cell for an analog mac application. The following description is presented to enable a person of ordinary skill in the art to make and use the various embodiments. Descriptions of specific devices, techniques, and applications are provided only as examples. Various modifications to the examples described herein can be readily apparent to those of ordinary skill in the art, and the general principles defined herein may be applied to other examples and applications without departing from the spirit and scope of the various embodiments.

Reference throughout this specification to 'one embodiment,' 'an embodiment,' 'one example,' or similar language means that a particular feature, structure, or characteristic described in connection with the embodiment is included in at least one embodiment of the present invention. Thus, appearances of the phrases 'in one embodiment,' 'in an embodiment,' and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of the embodiments of the invention. One skilled in the relevant art can recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, and they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Definitions

Example definitions for some embodiments are now provided.

Analog-to-digital converter (ADC) is a system that converts an analog signal into a digital numerical value.

Current mirror can be a circuit designed to copy a current through one active device by controlling the current in another active device of a circuit, keeping the output current constant regardless of loading.

GND refers to the universal Ground connection in electrical engineering. It is the reference point and represents a Zero potential for the entire circuit under discussion.

N-type metal-oxide-semiconductor logic uses n-type (−) MOSFETs (metal-oxide-semiconductor field-effect transistors) to implement logic gates and other digital circuits. nMOS transistors operate by creating an inversion layer in a p-type transistor body. This inversion layer, called the n-channel, can conduct electrons between n-type source and drain terminals. The n-channel is created by applying voltage to the third terminal, called the gate. nMOS transistors have four modes of operation: cut-off (or subthreshold), triode, saturation (sometimes called active), and velocity saturation.

Operational amplifier (herein 'op amp') can be a DC-coupled high-gain electronic voltage amplifier with a differential input an n-ended output (e.g. a single-ended output).

A parasitic element is a circuit element that is possessed by an electrical component but which it is not desirable for it to have for its intended purpose.

Example Computer Architecture and Systems

FIG. 1 illustrates an example block diagram of Analog MAC system 100 built with flash cells, according to some embodiments. System 100 comprises Flash Cell array 101, select lines 103 driven by select gate driver system 104, and control gate lines 105 driven by control gate driver system 106. The CG_line 105 and SG_line 103 connects to the flash cell CG (e.g. 205 of FIG. 2) and SG (e.g. 202 of FIG. 2) respectively. Flash cell, when activated by the CG_line and SG_line, generates a cell current which is carried to the ADC 109 via the bit-line (bl) 102. Under the influence of the cell current, the ADC can be dual slope in nature and accumulates charges into the ADC capacitor.

Figure 2:
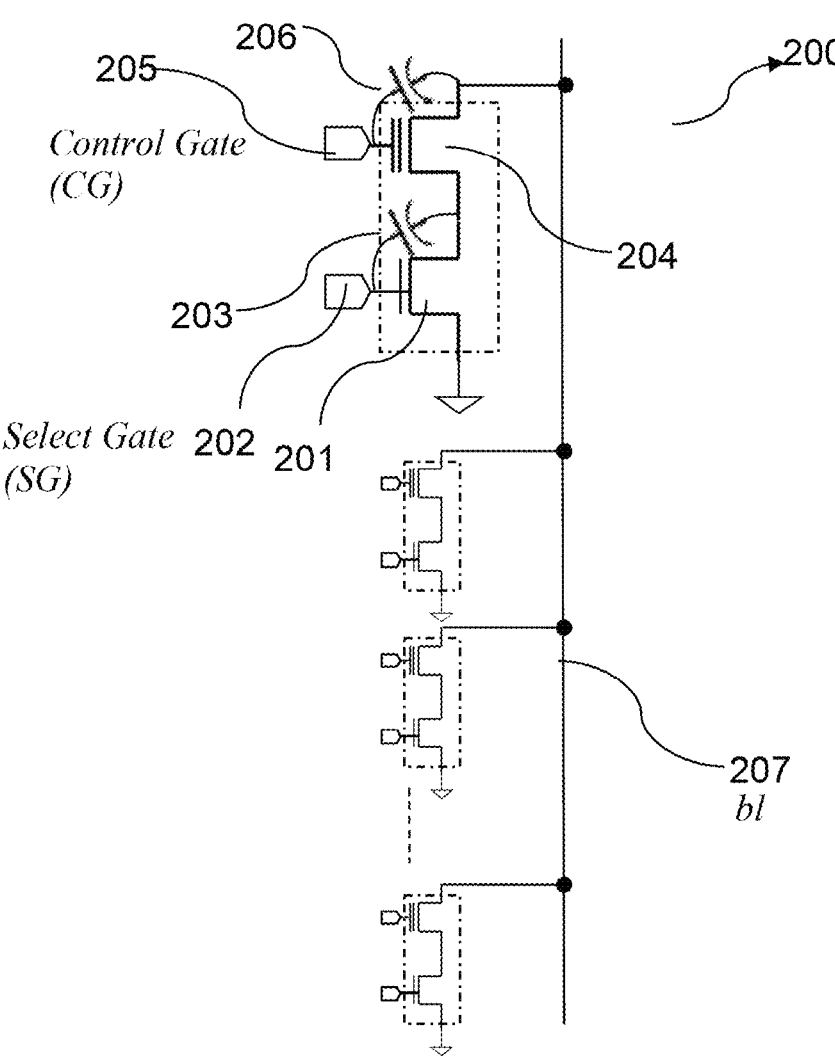
FIG. 2 illustrates the flash cell array with its essential elements, according to some embodiments.

FIG. 2 demonstrates a NAND flash cell array column 200 which consists of the flash element 204 and a select NMOS transistor 201 connected in series, according to some embodiments. The flash element gate terminal is named Control Gate (CG) 205. The NMOS 202 gate terminal named as a select gate (SG) 202 is used to enable the flash cell. The flash cell is accessed when logic is high at SG 202, and it generates a cell current which is controlled by analog voltage at CG 205 and bit-line 207. The produced current on the flash cell is carried out to the respective ADC unit through the bit-line (bl) 207. In an array of flash cells, a number of flash cells in a column are connected together on the bit-line (bl). Where the NMOS transistor 201 operates as a switch and enables access to the cell, the flash element 204, while accessed, shows a strong relationship between cell current output with the CG 205 voltage level. The select gate is operated at a full rail-to-rail input swing. Especially in low-power and low-current applications, unlike the SG, the CG level is designed to operate at a voltage level much lower than the SG level. The flash element 204 and the NMOS transistor 201 both contain a gate to drain capacitor (Cgd) 203 and 206, respectively. As discussed SG needs transitions rail to rail with a given level of VDD. Any activity or toggling at the SG 202 couples to the bit-line through Cgd 206 as the erroneous coupling noise and corresponding coupled charge propagates to the ADC system 300, resulting in an error. An activity on CG 205 results in lower coupling noise as the CG voltage level is much smaller than the SG. For example, where the SG level is required to be around 2.3 v to 2.7 v for slow and fast corners respectively, the CG can be operated at 300 mV or lower.

Figure 3:
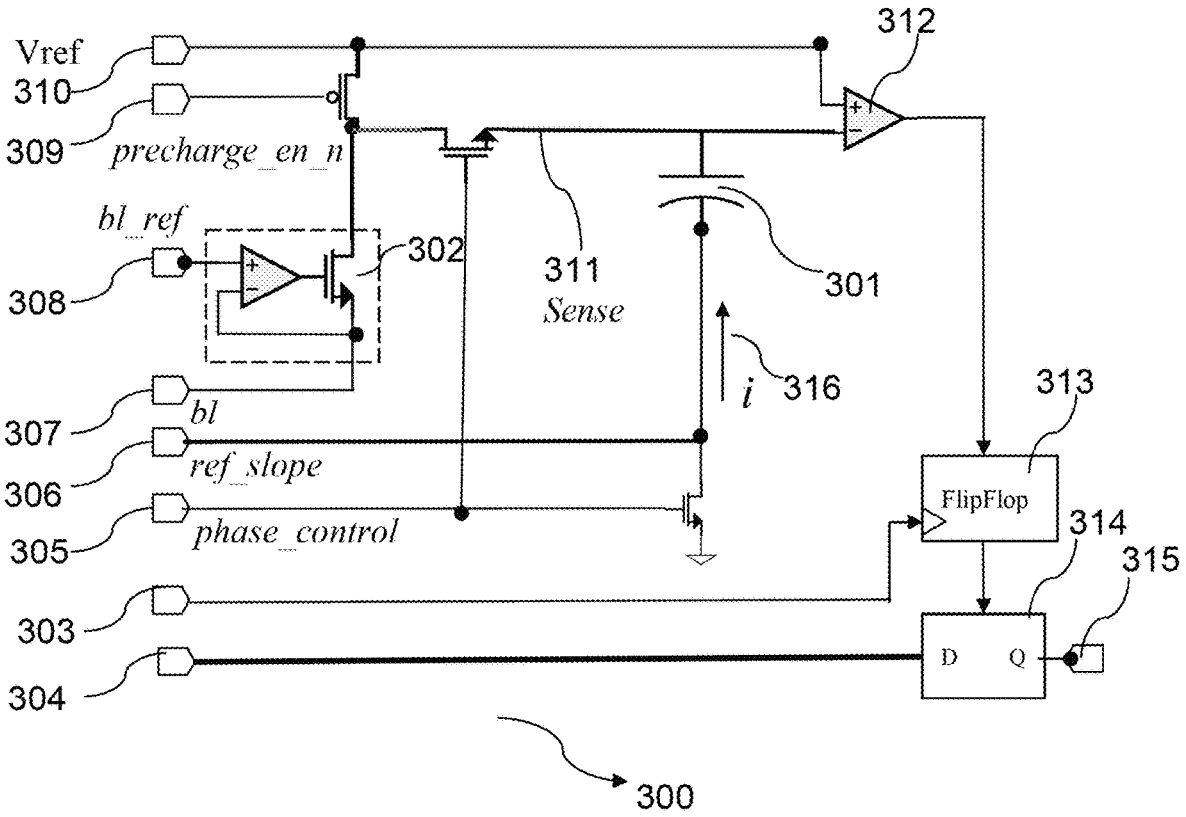
FIG. 3 illustrates an example circuit diagram of the ADC system, according to some embodiments.

FIG. 3 represents the ADC system 300 for a single flash cell array column, which serves the purpose of accumulating the charges from all the flash cells in a column and converting the developed charge to its digital value as the MAC output digitally, according to some embodiments. The cell current generates the ADC current 316 through the bit-line and the ADC capacitor 301. The incoming charge in the form of current over a given time, from flash array column 101 of FIG. 1 is made to accumulate in capacitor 301, which is initially charged to voltage level Vref 310. In the process of accumulating charges the bit-line clamp system 302 maintains constant reference bit-line potential (bl_ref) 308 at the bit-line (bl) 307 so that the flash cells produce the current under a constant bl potential irrespective of voltage buildup at the capacitor 301. At the evaluation phase the capacitor node 311 is made to charge back towards Vref, hence converted to digital output as per the principle of dual slope ADC. The signal phase_control 305 controls the phase of the ADC—the logic high on this signal is required during the charge accumulation phase and a logic low initiates the ADC resolution phase. Accordingly, the ADC is built with comparator 312, comparator output synchronizer flipflop 313, and latch 314 to latch the counter data at ADC output at the event of resolution completion.

The flash cells is producing charge as output which is a product of current and Time=I*T. The system utilizes this property for the Multiplication action of MAC operation. The current of the flash cell is controlled by the CG_line voltage level, which controls the gate terminal (CG) of the flash element, in addition to the programmed threshold voltage onto the flash cell. As per the invention disclosure, the time is the other operand for multiplication to be received as an input to the system. The input data is converted to PWM (pulse width modulation) output. The PWM system generates a pulse whose width is proportional to the data input value. The pulse width generated by the PWM output finally translates to the time ("t") over which the flash cells continue to supply the cell current ("i").

Figure 4:
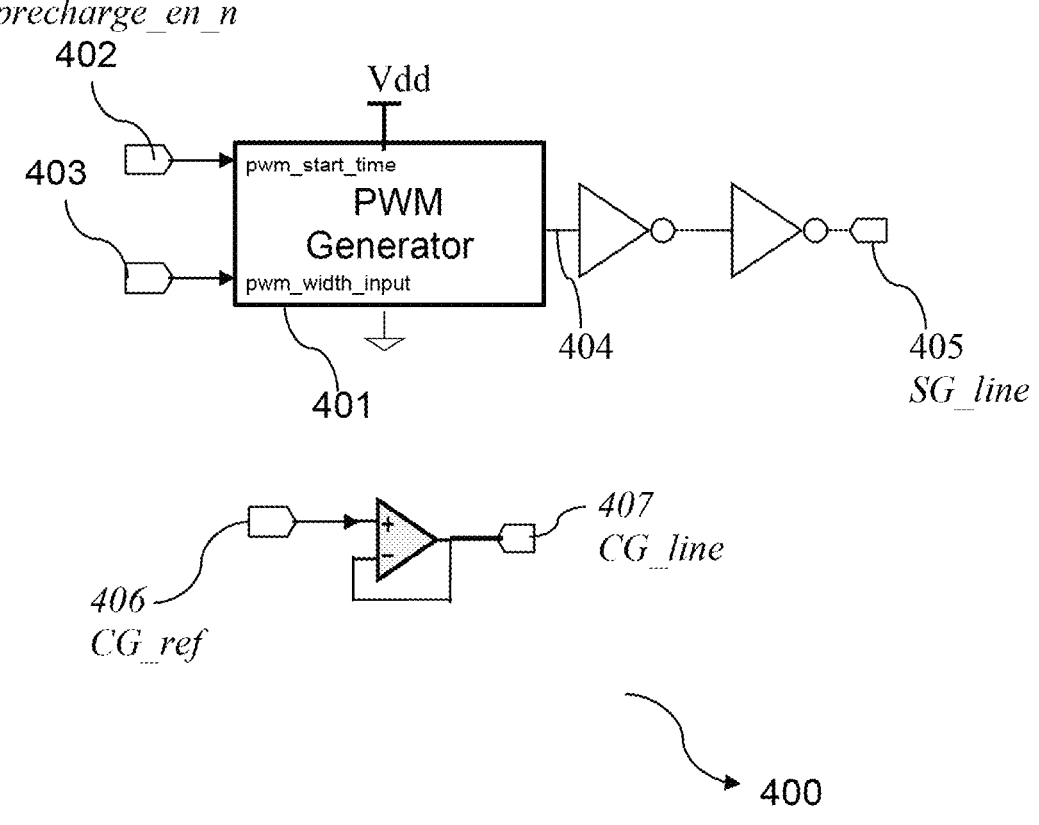
FIG. 4 illustrates the circuit and block diagram of the invention disclosure PWM on the Select Gate line, according to some embodiments.

FIG. 4 illustrates the corresponding circuit and block diagram, according to some embodiments. System 400 demonstrates the implementation of an SG_line and a CG_line. System uses a PWM generator 401. The system has two (2) ports "pwm_start_time" and "pwm_width_input". The PWM works on the inputs—i) the start trigger signal on port "pwr_start time" and ii) The signal on port "pwm_width_input" which defines the pulse width in time. One of the ADC control signal "precharge_en_n" 402 (e.g. as shown as 309 in FIG. 3) rising edge is used as the triggering signal for the PWM pulse rising edge. One of the operands for the Multiplication operation is represented as 403. The value of the data on 403 on the port "pwm_width_input" defines the pulse of the PWM output. Therefore, the "precharge_en_n" 402 causes the PWM output signal 404 to rise transition and the signal 404 makes a falling transition upon timeout as defined by the data input 403 value. The 404 eventually is buffered to produce SG_line 405 (e.g. also marked as 103 in FIG. 1). The analog voltage reference voltage CG_ref 406 is buffered by a unity gain amplifier to produce CG_line 407. Therefore, the CG_line appears as a static analog signal with a voltage level defined by CG_ref. The CG_line voltage level defines and produces the cell current ("i") whereas the SG_line controls the time ("t") over which the cell produces the cell current. As a result, the flash cell produces a total charge $Q=i*t$.

Figure 5:
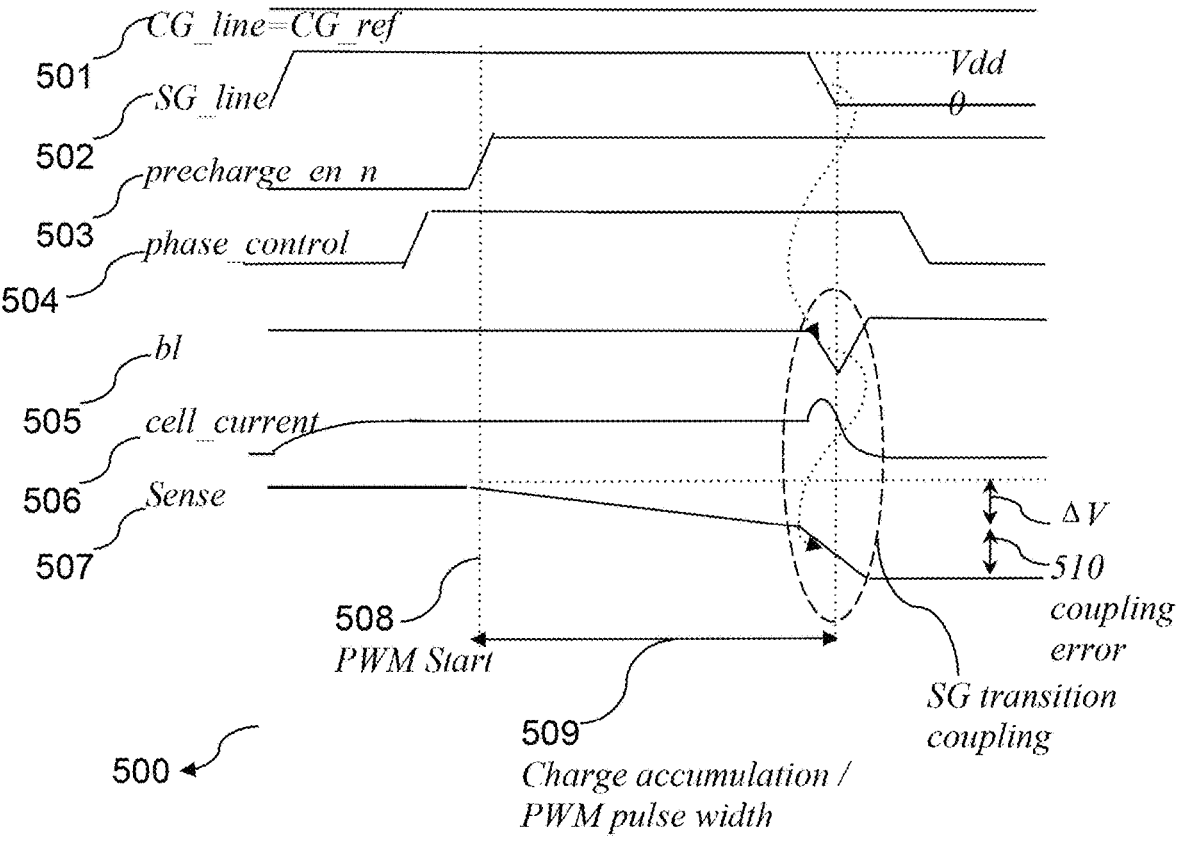
FIG. 5 Signal flow diagram for the scheme PWM on the Select Gate line, according to some embodiments.

FIG. 5 illustrates the signal flow diagram for the scheme PMW on SG_line as demonstrated in FIG. 4, according to some embodiments. Signal 501 CG_line is shown as a static signal and clamped to some voltage CG_ref. The SG_line 502 makes the required transition which finally enables the flash cells to produce cell current for the specified period of time. As the SG_line makes a rising transition cell current 506 starts building up. Once the current is settled ADC control signal precharge_en_n 503 is made to make a rising transition. As a result the cell current now starts flowing through the ADC capacitor and makes charge buildup by discharging the ADC sense node (311 of FIG. 3). Hence, the phase which starts with the rising edge of the precharge_en_n 503 is termed the charge accumulation phase. The precharge_en_n 503 also starts the PWM as shown by 508. At the expiration of PWM pulse width time 509 as defined by the input data, the SG_line makes a falling transition. With the fall of SG_line, the charge accumulation phase ends. Therefore, SG_line makes both rising and falling rail-to-rail (VDD and 0) transitions within the MAC operation cycle. From waveform 500, it can be observed that only the falling transition of SG_line lies in the charge accumulation window 509. Therefore, the coupling charge only due to the falling transition of the SG_line gets accumulated to the ADC capacitor and cannot be cancelled out by the SG_line rising transition coupling. The coupling action propagates through Cgd (203 of FIG. 2) and bit-line 505 to the Sense node 507. The coupling results in coupling error 510 due to extra discharge of the Sense node.

Figure 6:
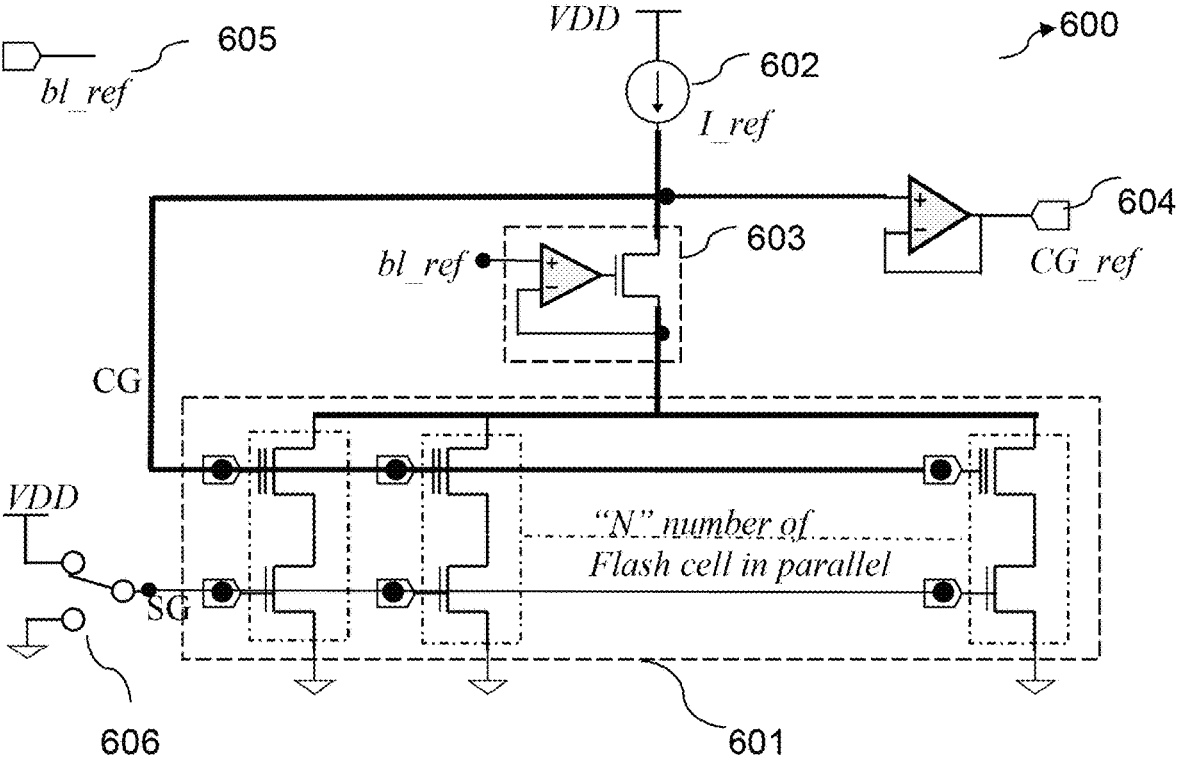
FIG. 6 illustrates the circuit and block diagram for the CG_ref voltage generation, according to some embodiments.

FIG. 6 illustrates the CG_ref voltage level generation system 600, according to some embodiments. The system 600 employs a reference flash cell array 601 of "N" number flash memory cells which is in diode-connected mode. The flash cells are programmed with a low threshold voltage. Therefore the diode connected flash cell array 601 while supplied with a low current, generates a low voltage which represents CG_ref 604 after a unity gain buffer. The system is designed to compensate for the flash array 101 of FIG. 1 against temperature and ageing effect. The system 603 bit line clamp system is used to maintain a constant bit-line voltage. It uses the same bl_ref as the ADC system 300 of FIG. 3. System 600 generates a CG_ref much lower than the supply rail=VDD as the reference flash cells under array 601 are programmed with a small threshold voltage. For example, where the SG level is required to be around 2.3 v to 2.7 v for slow and fast corners respectively, the CG is operated as low as 300 mV.

Figure 7:
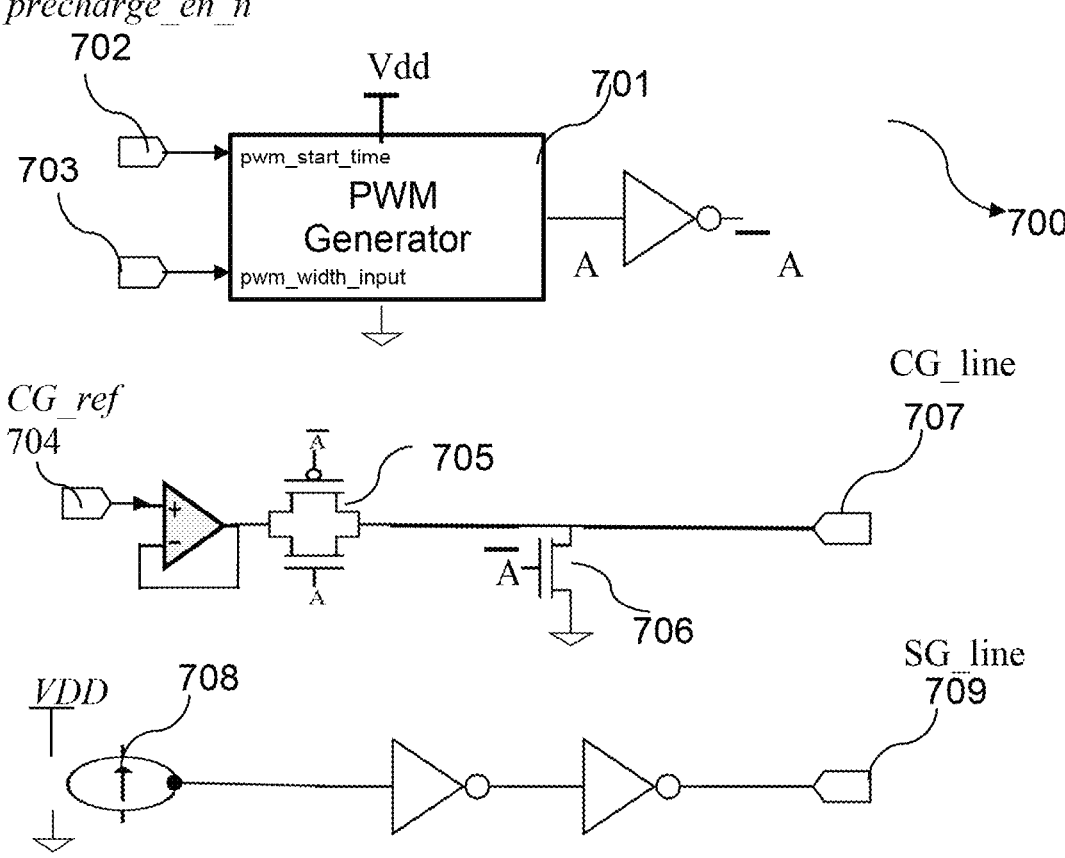
FIG. 7 illustrates the circuit and block diagram of the invention disclosure PWM on the Control Gate line, according to some embodiments.

FIG. 7 While system 400 in FIG. 4 illustrates the one scheme where the CG_line controls the current and SG_line controls the time as PWM is applied on the SG_line, System 700 demonstrates another scheme where PWM is applied to CG_line itself and SG_line made to be constant VDD of the entire MAC operation. Therefore, as per the system 700 CG_line controls both the current and the time involved in the multiplication operation. The PWM generator 701 receives precharge_en_n 702 and data input 703. While the rising transition on 702 makes a rising transition on the PWM output, the data input 703 value defines the pulse width of the PWM output. The PWM output and its complementary output are used to operate the transmission gate 705 and an NMOS transistor 706. The input to the transmission gate is the buffered CG_ref 704, which is generated by system 600 as shown in FIG. 6. The output of 705 finally connects to CG_line 707. Therefore, CG_line makes a swing between 0 and CG_ref voltage levels. While CG_line makes transitions, SG_line 709 is made to be constant at the VDD level for the entire MAC operation window. The scheme allows for lowering the coupling to the flash memory cells by reducing the CG_line voltage. The CG_line voltage can be reduced because the threshold voltages of the flash memory cells are programmable and can also be reduced with the reduction of control gate voltage. Hence the memory cell thresholds can be programmed to be lower to accommodate for the lower CG_line voltage—consequently giving the same desired cell currents since the cell currents are a function of the difference between the cell threshold voltage and the cell control gate voltage. This scheme substantially reduces the errors due to the parasitic coupling during switching of the cells to on and off states.

Figure 8:
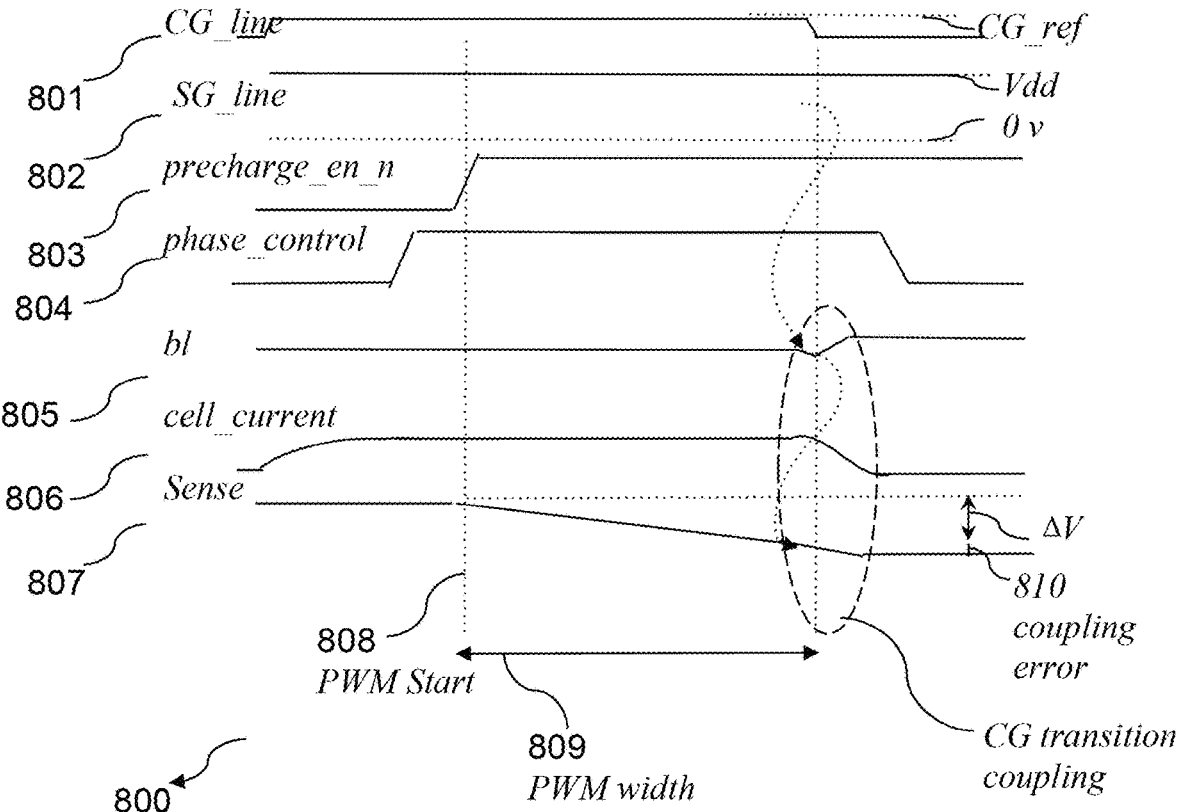
FIG. 8 illustrates an example Signal flow diagram for the scheme PWM on the Control Gate line, according to some embodiments, according to some embodiments.

FIG. 8 illustrates the signal flow diagram for the scheme PMW on CG_line as demonstrated in FIG. 7, according to some embodiments. Signal 502 SG_line is shown as a static signal and clamped at VDD and enables the Flash cell select gate for the entire MAC operation. The CG_line 501 makes the required transition (e.g. level zero to CG_ref and back to Zero) which finally enables the flash cells to produce cell current defined by pulse level and for the specified period of time defined by pulse width. As the CG_line makes a rising transition cell current 806 starts building up. Once the current is settled ADC control signal precharge_en_n 803 is made to make a rising transition. As a result the cell current now starts flowing through the ADC capacitor and makes charge buildup by discharging ADC sense node 807 (e.g. 311 of FIG. 3) from a pre-charged value V_ref. Hence, the phase which starts with the rising edge of the precharge_en_n 803 is termed as the charge accumulation phase. The precharge_en_n 803 also starts the PWM as shown by 808. At the expiration of PWM pulse width time 509 as defined by the input data 403 in FIG. 4, the CG_line makes a falling transition. With the fall of CG_line, the charge accumulation phase ends. Therefore, CG_line makes both rising and falling transitions (e.g. voltage level zero and CG_ref) within the MAC operation cycle. From waveform

7

8

800, it can be observed that only the falling transition of CG_line lies within the charge accumulation window 809. Therefore, the coupling charge only due to the falling transition of CG_line gets accumulated to the ADC capacitor and cannot be cancelled out by the CG_line rising transition coupling. The coupling action propagates through Cgd (e.g. 206 of FIG. 2) and bit-line 805 (e.g. 207 of FIG. 2) to the Sense node 807 (e.g. 311 of FIG. 3). The coupling results in coupling error 810 due to extra discharge of the Sense node. However, the CG_line swing is much smaller (e.g. only 300 mV in contrast to SG_line swing of 2.3V) to create any significant erroneous coupling.

Conclusion

Although the present embodiments have been described with reference to specific example embodiments, various modifications and changes can be made to these embodiments without departing from the broader spirit and scope of the various embodiments. For example, the various devices, modules, etc. described herein can be enabled and operated using hardware circuitry, firmware, software or any combination of hardware, firmware, and software (e.g., embodied in a machine-readable medium).

In addition, it can be appreciated that the various operations, processes, and methods disclosed herein can be embodied in a machine-readable medium and/or a machine-accessible medium compatible with a data processing system (e.g., a computer system), and can be performed in any order (e.g., including using means for achieving the various operations). Accordingly, the specification and drawings are to be regarded in an illustrative rather than a restrictive sense. In some embodiments, the machine-readable medium can be a non-transistor form of machine-readable medium.

What is claimed as new and desired to be protected by Letters Patent of the United States is:

1. An ADC system is described which reduces analog to digital conversion errors and is comprised of:
   a PWM (pulse width modulator) circuit providing various pulse-widths to a multiplicity of flash cells to charge or discharge different amounts of electric charge depending on a Control Gate (CG) bias and a pulse-width of a respective PWM pulse on a cell.

2. The system of claim 1, wherein a Control Gate (CG) line value appears as a static analog signal with a voltage level defined by the Control Gate (CG) ref voltage.

3. The system of claim 2, wherein a CG_line voltage level defines and produces a charging or discharging cell currents ("I") over different PWM pulse widths.

4. The system of claim 3, wherein a Select Gate (SG)_line value controls the time ("t") over which the cell produces the cell current.

5. The system of claim 4, wherein a flash cell produces a total charge q=i*t.

6. The system of claim 5, wherein a Analog Multiplier-and-Accumulator (MAC) system is built with a Flash Cell array, and wherein a plurality of flash cells in the Flash Cell Array produce cumulative charge which is summation of all the charge produced by each cell in a bit line of the array of cells.

7. The system of claim 6, wherein a plurality of select lines of the Analog MAC system are driven by a select gate driver system and a plurality of control gate lines of the Analog MAC system are driven by a control gate driver system.

8. The system of claim 7, wherein a CG_line and an SG_line connects to a flash cell control gate and a flash cell select gate.

9. The system of claim 8, wherein the plurality of flash cells, when activated by the CG_lines and SG_lines, generate cell current with a total charge which is summation of charge produced by each cell in a bit line and which is sensed by the ADC in analog domain via bit-lines and converted to a numeric value for digital manipulation.

10. The system of claim 9, wherein the errors in ADC conversion is minimized by reducing the glitches from PWM switching to couple into a plurality of memory cells.

11. The system of claim 10, wherein various spurious errors due to system non-linearities are corrected by trimming circuits.

12. The system of claim 10, wherein the ADC conversion errors are minimized by keeping the select gate voltage static (always on) during charge accumulation and using the control gate voltage as well as a control gate voltage turn on time to control both a current and the duration of current.

13. The system of claim 12 where the control gate voltage is minimized so as to reduce a parasitic capacitive coupling to the memory cells which can accumulate to cause errors in the ADC count.

14. The system of claim 12 where the memory cells are programmed to lower threshold voltages in line with a lowered control gate voltage so as to still provide a targeted current levels.

* * * * *